(12) United States Patent
Cheng

(10) Patent No.: US 7,474,132 B2
(45) Date of Patent: Jan. 6, 2009

(54) AUTOMATIC SELF-ADAPTIVE KEEPER SYSTEM WITH CURRENT SENSOR FOR REAL-TIME/ONLINE COMPENSATION FOR LEAKAGE CURRENT VARIATIONS

(75) Inventor: Zhibin Cheng, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 47 days.

(21) Appl. No.: 11/566,494

(22) Filed: Dec. 4, 2006

(65) Prior Publication Data
US 2008/0129346 A1 Jun. 5, 2008

(51) Int. Cl.
*H03B 1/00* (2006.01)
*H03B 3/00* (2006.01)
(52) U.S. Cl. ....................................... 327/108
(58) Field of Classification Search ................ None
See application file for complete search history.

(56) References Cited

U.S. PATENT DOCUMENTS

2002/0130709 A1* 9/2002 Teel et al. .................... 327/540

2006/0033530 A1* 2/2006 Seo .............................. 326/81

* cited by examiner

*Primary Examiner*—Rexford Barnie
*Assistant Examiner*—Matthew C Tabler
(74) *Attorney, Agent, or Firm*—Josh G. Cockburn; Dillon & Yudell LLP

(57) ABSTRACT

A device and method for automatically detecting and optimally compensating die leakage current under a wide range of leakage conditions. A variable or reconfigurable (self-adaptive) keeper tracks current leakage online (in real time). The control input to the keeper is coupled to a leakage current sensor, which is in turn coupled to a dummy cell that generates the exact leakage current as the load. The current sensor regulates the control input in real time to produce a leakage compensation enable signal, which reconfigures and/or varies the strength of the keeper. Having the compensation capability of a strong keeper during elevated conditions and the capability of a weaker keeper during normal operational conditions, the self-adaptive keeper system offers high read/write performance, flexibility and circuit robustness in real time.

7 Claims, 7 Drawing Sheets

AUTOMATIC SELF-ADAPTIVE KEEPER SYSTEM WITH CURRENT SENSOR FOR REAL-TIME/ONLINE COMPENSATION FOR LEAKAGE CURRENT VARIATIONS

BACKGROUND OF THE INVENTION

1. Technical Field

The present invention generally relates to integrated circuits and in particular to leakage current in integrated circuits. Still more particularly, the present invention relates to compensation of leakage current in integrated circuits.

2. Description of the Related Art

Continued development in integrated circuit (IC) technology is driven by a desire for the ever decreasing size of circuit components on the IC die. As the technology scales down to deep sub-micron levels, the inter-die leakage variation increases dramatically. Large variations in device threshold voltage exist among dies, which lead to a wide range of die-to-die leakage spread across process corners.

The traditional design for worst-corner process variation using a fixed-strength keeper often over-compensates the leakage in the majority of dies of the low leakage corner in order to satisfy a small number of dies of the high leakage corner. Unfortunately, the high leakage dies still do not satisfy the robustness requirements with a keeper sized for the faster corner leakage. This over-compensation degrades the overall performance of the chip. The inability to satisfy performance requirements reveals the drawbacks of a conventional keeper used under a wide range of inter or intra-die variations.

SUMMARY OF THE INVENTION

Disclosed is a device and method for automatically detecting and optimally compensating die leakage current under a wide range of leakage conditions. A variable or reconfigurable (self-adaptive) keeper tracks current leakage online (in real time). The control input to the keeper is coupled to a leakage current sensor, which is in turn coupled to a dummy cell that generates the exact leakage current as the load. The current sensor regulates the control input in real time to produce a leakage compensation enable signal, which reconfigures and/or varies the strength of the keeper.

The keeper system may also be used as a burn-in keeper where the current sensor circuit generates an online burn-in enable signal. The burn-in signal reconfigures the keeper strength to handle the elevated burn-in test conditions with respect to temperature, voltage and leakage current. Having the compensation capability of a strong keeper during elevated conditions and the capability of a weaker keeper during normal operational conditions, the self-adaptive keeper system offers high read/write performance, flexibility and circuit robustness in real time.

The above as well as additional objectives, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF AN ILLUSTRATIVE EMBODIMENT

Figure 1:
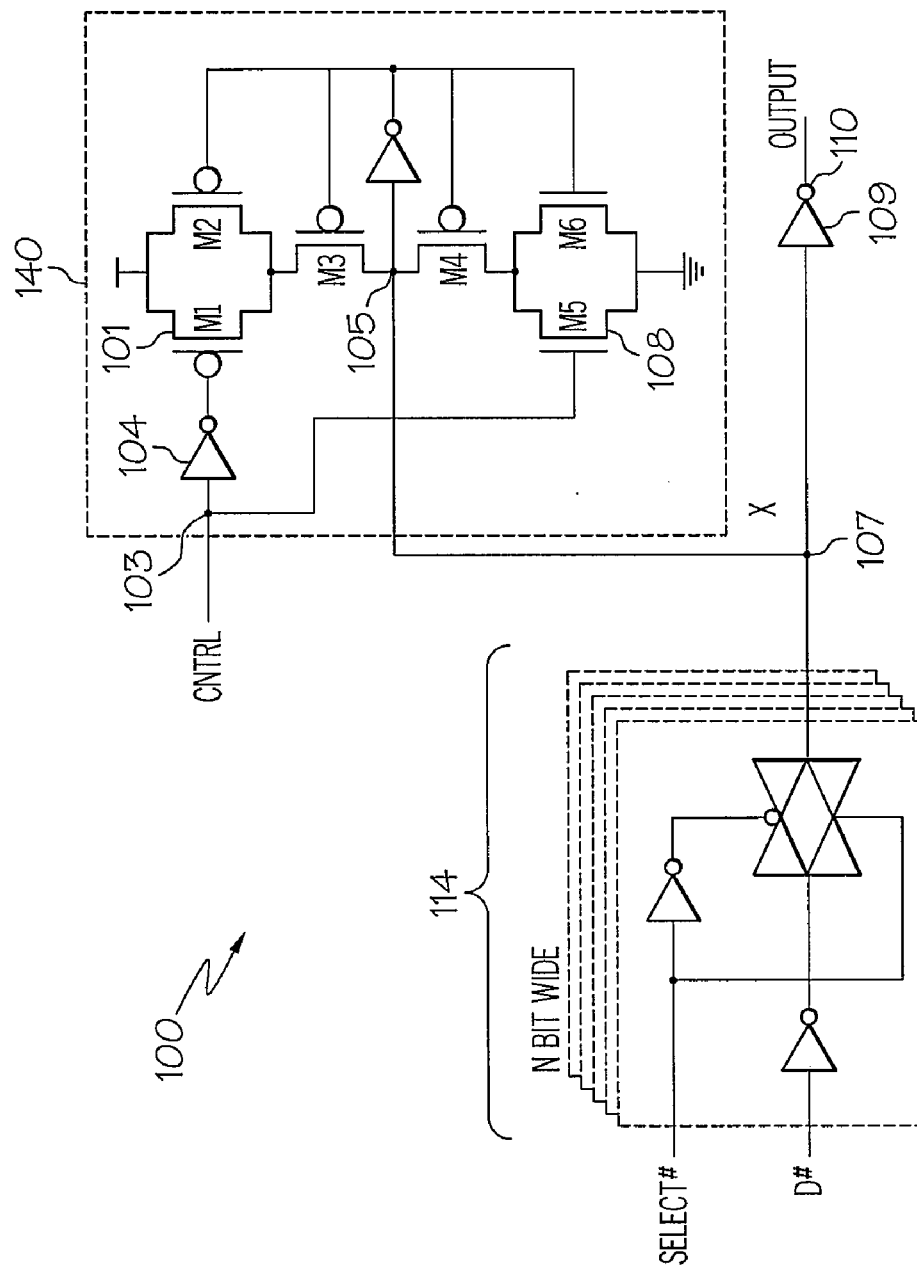
FIG. 1 illustrates an integrated circuit (IC) with a reconfigurable keeper used for leakage current compensation, according to the prior art.

The present invention provides a device and method for automatically detecting and optimally compensating die leakage current under a wide range of leakage conditions. A variable or reconfigurable (self-adaptive) keeper tracks current leakage online (in real time). The control input to the keeper is coupled to a leakage current sensor, which is in turn coupled to a dummy cell that generates the exact leakage current as the load. The current sensor regulates the control input in real time to produce a leakage compensation enable signal, which reconfigures and/or varies the strength of the keeper.

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined only by the appended claims.

Within the descriptions of the figures, similar elements are provided similar names and reference numerals as those of the previous figure(s). Where a later figure utilizes the element in a different context or with different functionality, the element is provided a different leading numeral representative of the figure number (e.g, 4xx for FIG. 4 and 5xx for FIG. 5). The specific numerals assigned to the elements are provided solely to aid in the description and not meant to imply any limitations (structural or functional) on the invention.

It is also understood that the use of specific parameter names are for example only and not meant to imply any limitations on the invention. The invention may thus be implemented with different nomenclature/terminology utilized to describe the above parameters, without limitation.

With reference now to the figures, FIG. 1 illustrates an integrated circuit (IC) with a reconfigurable keeper used for leakage current compensation, according to the prior art. IC 100 comprises N-bit wide static MUX-latch 114, which generates an output signal that is passed through inverter 109 to produce output 110. N-bit wide static MUX-latch 114 is connected to inverter 109 via a wired path. IC 100 also comprises reconfigurable keeper 140, which is coupled to the wired path at node 107. Keeper 140 comprises a plurality of interconnected transistors, which provide a pull-up keeper circuit 101 and a pull down keeper circuit 108. Keeper also comprises control input node 103 at which a control input (ctrl) is received.

Within IC 100, reconfigurable keeper 140 is used to provide compensation for leakage current from N-bit wide static MUX-latch 114. Keeper 140 is required to hold the state of internal storage nodes of latches. The worst-case leakage path is through parallel transmission gates in the select latches. With the conventional implementation, the keeper strength is adjusted with an external (manual) control signal, i.e., ctrl, which is received at ctrl input node 103. When ctrl (input) is high, keeper 140 will provide additional compensation strength by utilizing pull-up circuit 101 to ensure the robustness on high-leakage dies during normal operation or during burn-in tests. When ctrl is low, the compensation strength is reduced to a normal level by utilizing pull-down circuit 108 for the low-leakage dies. Compensation for a leakage current induced voltage drop at internal storage node 107 is achieved by the flow of compensation current from keeper 140. When ctrl (input) is high, the compensation current flows through transistor M3 through node 105, and towards internal storage node 107. When ctrl is low, the compensation current flows through transistor M4 through node 105, and towards internal storage node 107. Those of skill in the art are familiar with the conventional keeper circuit and its operation within an IC configuration such as FIG. 1.

Figure 2:
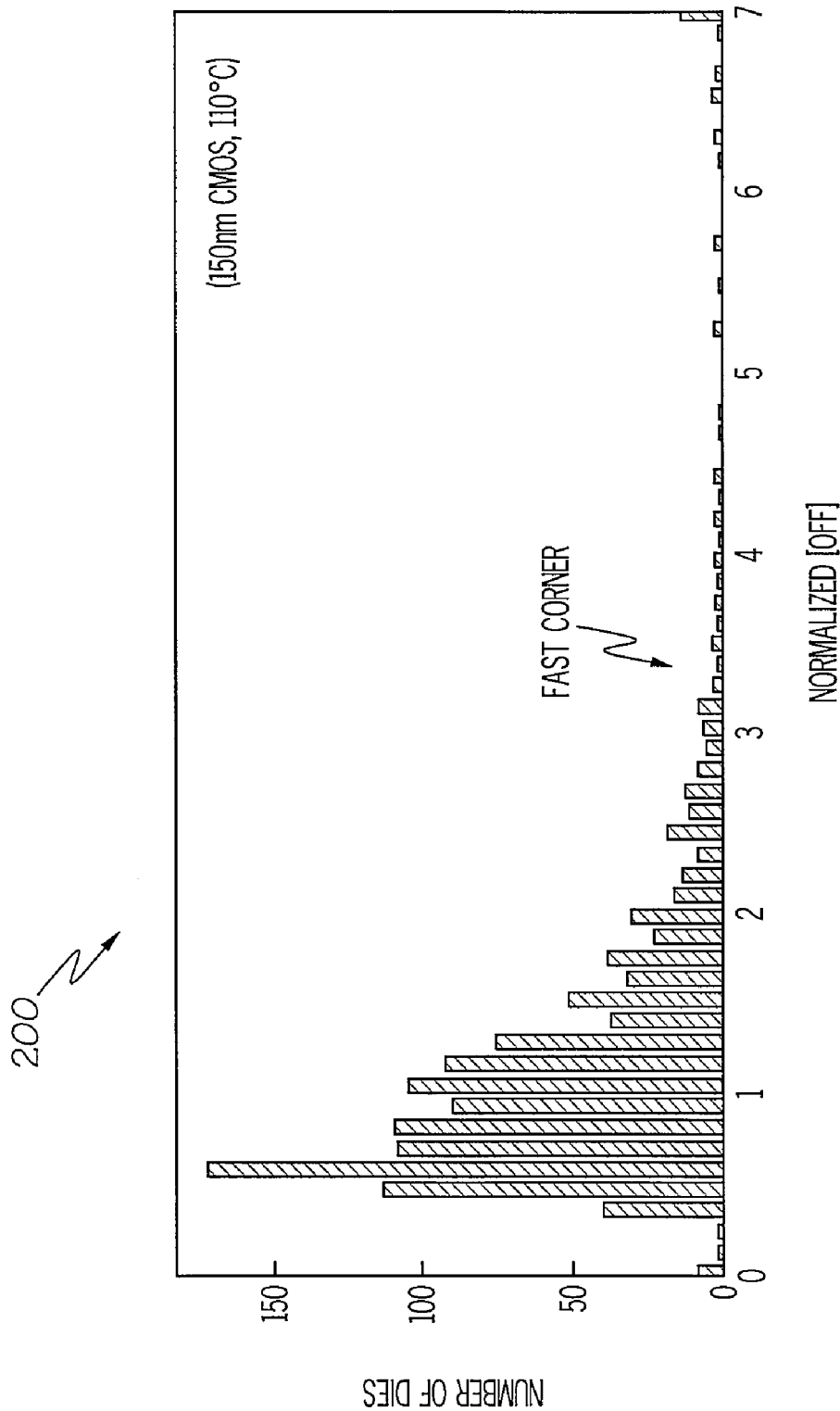
FIG. 2 is a histogram illustrating the distribution of the Negative Field Effect Transistor (NFET) leakage current in a 150-nm CMOS process, according to the prior art.

FIG. 2 is a histogram illustrating the distribution of the Negative Field Effect Transistor (NFET) leakage current in a 150-nm CMOS process, at 110° C., according to the prior art. In FIG. 2, the leakage current distribution shows a wide range of leakage variations (horizontal axis) across the processor corners for over a thousand IC dies. The majority of the dies are represented by the low end of the leakage distribution curve. Thus, as shown, the traditional design for worst-case process corners is an inefficient methodology that would result in overall degradation of chip performance. Existing methods to compensate for and restore the robustness of worst-case leakage dies and the performance of low-leakage dies often includes over-sizing the keeper. However, as previously described, over-sizing the keeper for worst-case leakage corners will post a significant performance penalty for a majority of dies at the low or normal leakage corners.

Figure 3:
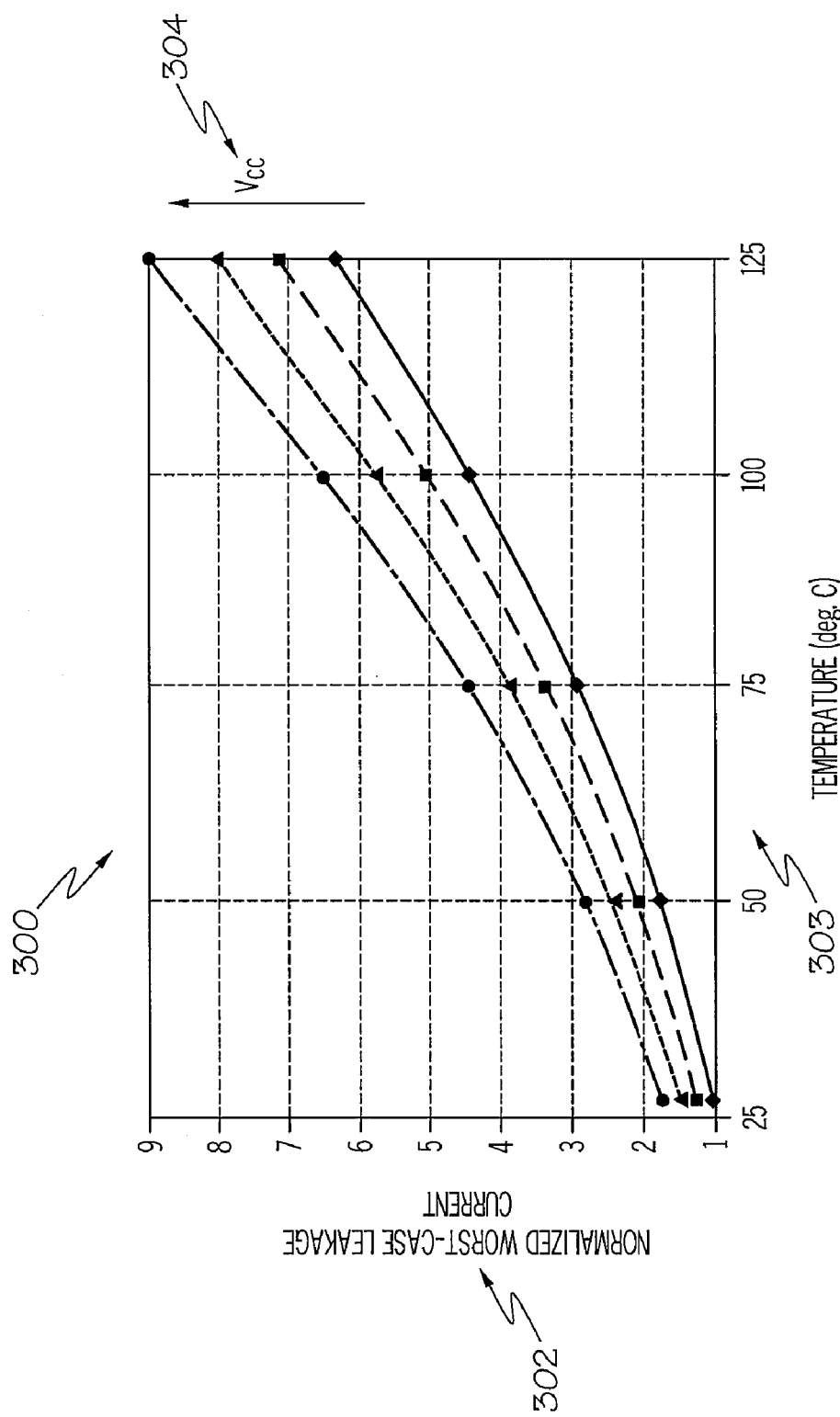
FIG. 3 depicts exponential curves illustrating the simulation of an 8-to-1 MUX-Latch (register file), at a range of temperatures and threshold voltages, according to the prior art.

The leakage distribution and strength variation have been illustrated by the histogram 200 of FIG. 2. The worst-case leakage variation, in elevated conditions, is illustrated by the exponential curves of FIG. 3. FIG. 3 depicts exponential curves which illustrate the results of simulating the 8-to-1 MUX-Latch (register file) at a range of temperatures and threshold voltages, according to the prior art. Curves 300 shows results from burn-in process simulated conditions (elevated temperature and supply voltage) which lead to large increases in leakage currents. Waveform 300 also shows a range of leakages 302 as a result of range of temperatures 303 and range of supply voltages 304.

The present invention overcomes worst case and low leakage effects, in addition to the performance penalty (for a majority of dies at the low or normal leakage corners) caused by using an over-sized keeper (illustrated in FIG. 1) intended to reduce leakage effects. Specifically, the present invention provides an advanced keeper system, described herein as an "online keeper".

Figure 4:
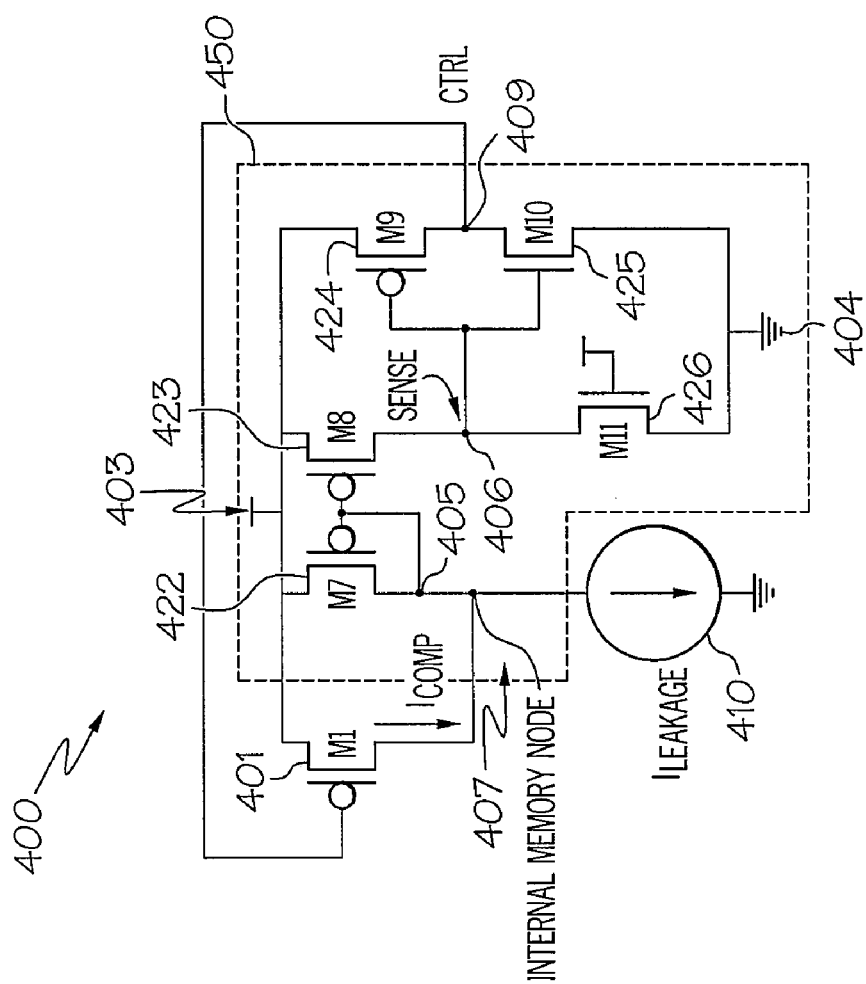
FIG. 4 illustrates an IC with a current sensor and leakage current source coupled to a keeper to provide an enhanced online adaptive keeper system used for leakage current compensation, according to an illustrative embodiment of the invention.

FIG. 4 illustrates an IC with a current sensor and leakage current source used for enhancing leakage current compensation by an online keeper, according to an illustrative embodiment of the present invention. Integrated Circuit (IC) 400 comprises current sensor 450, which is coupled to keeper transistor M1 401 and current leakage source (I.sub.leakage) 410. Current sensor 450 comprises a plurality of interconnected transistors (labeled M7-M11), which are described herein as positive and negative field effect transistors (PFETs and NFETs), although the invention is also applicable to other types of transistors. The first three transistors, PFET M7 422, PFET M8 423 and PFET M9 424 have their source terminals coupled to common high voltage node 403. The gate of PFET M7 422 and PFET M8 423 are connected to each other, with the common gate terminals also coupled to the drain terminal of PFET M7 422. The drain terminal of PFET M7 422 is then connected to current leakage source 410 at internal storage/memory node 407.

The gate terminal of PFET M8 423 is connected at sense node 406 to the source terminal of NFET M11 426 and to the gate terminals of PFET M9 424 and NFET M10 425. Both these gate terminals are connected together and to a node connecting various terminals of transistors M8, M9, M10 and M11, as illustrated. According to the invention, this node is presented as sense node 406. PFET M9 424 is coupled at its drain terminal to the source terminal of NFET M10 425. The drain terminal of NFET M10 425 is coupled to common ground (or low voltage) node 404 along with the drain terminal of NFET M11 428, whose gate is coupled to high voltage node 403.

Keeper transistor (PFET) M1 401 is coupled in parallel across PFET M7 422, such that keeper transistor M1 401 also has its source terminal connected to common high voltage node 403 and its drain terminal connected to the drain terminal of PFET M7 422 at internal memory node 407. Keeper transistor M1 401 generates a compensation current ($I_{comp}$), which flows through internal memory node 407 towards current leakage source 410.

Current sensor 450 is also illustrated as having a "sen" node (connection point) 405, which is at or below the node at which the gate terminals of PFET M7 422 and PFET M8 423 connect to the drain terminal of PFET M7 422. The functionality of sen node 405 is described below with reference to FIGS. 5 and 6. Current sensor further provides ctrl node 409, which is the point of connection between the drain terminal of PFET M9 424 and NFET M10 425. Ctrl node 409 also provides a point of connectivity between current sensor 450 and the gate terminal of keeper transistor M1 401.

Leakage current source 410 is connected to internal storage/memory node 407 and facilitates testing/simulation of IC 400 by providing a wide range of current leakage variation. In online/real-time operation, a dummy circuit (for example, dummy circuit 616 of FIG. 6), replaces leakage current source 410. With the above described configuration, IC 400 provides an online (real time) digitally controlled strength keeper that holds the state of the internal storage/memory node 407 with optimal compensation strength against leakage at various process variation corners.

The configuration of PFET M7 422 with PFET M8 423 provides a current mirror circuit. In IC 400, the leakage current from leakage current source 410 is sensed at internal storage node 407 and amplified through the current mirror circuit (PFET M7 422 and PFET M8 423). The amplified leakage current (leaving M8 423) charges up sense node 406 to high on resistive transistor (M11) 408. Then, the voltage at ctrl node 409 becomes low after the voltage at sense node 406 is inverted. The low voltage at ctrl node 409 turns on keeper transistor M1 401. When keeper transistor M1 401 turns on, compensation current flows through keeper transistor M1 401, and the compensation current then compensates the voltage loss at storage/memory node 407.

Figure 5:
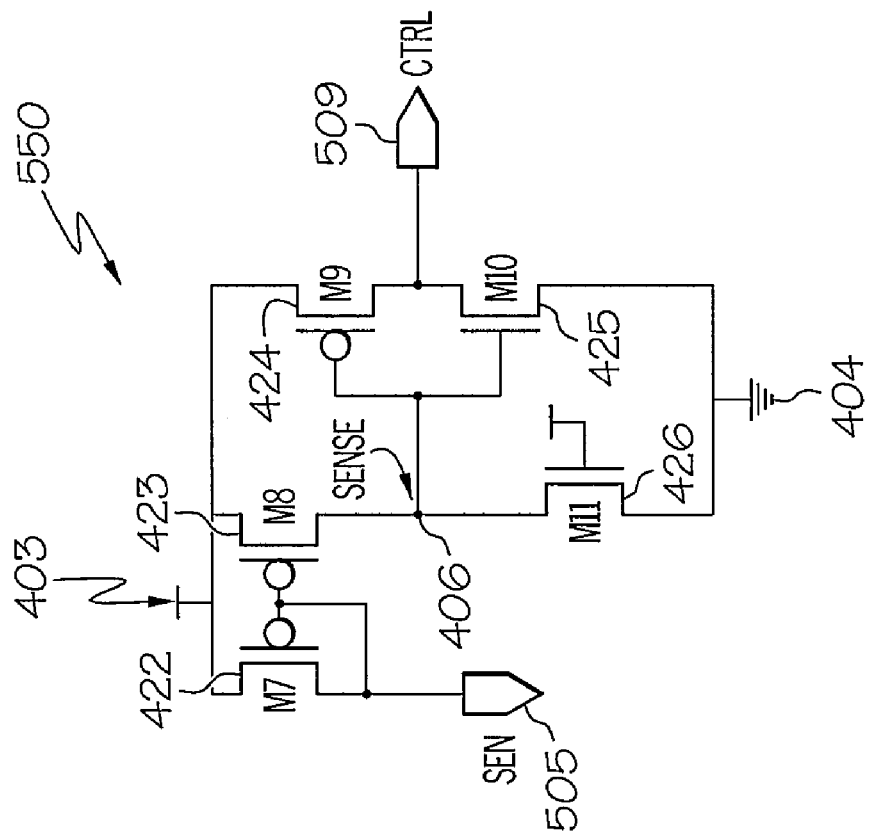
FIG. 5 illustrates the current sensor of FIG. 4, which is utilized for the automatic generation of a current compensation enable signal for a keeper, according to an illustrative embodiment of the present invention.

FIG. 5 illustrates the same current sensor circuitry of current sensor 450, which is used for automatic generation of a current compensation enable signal, according to an illustrative embodiment of the present invention. Current sensor 550 of FIG. 5 has been described in detail within the description of current sensor 450 of FIG. 4. No further description of the components and connectivity will be provided to avoid repetitiveness. However, current sensor 550 of FIG. 5 provides connectors for two connection nodes, namely sen connector 505 at sen node and ctrl connector 509 at the ctrl node. These connectors may be used to "plug-in" current sensor to devices for a simulation/test circuit as shown in FIG. 4. During online/real-time operation, current sensor 550 is coupled to a keeper circuit and dummy circuit and functions as online current sensor 550 of IC 600 of FIG. 6.

Figure 6:
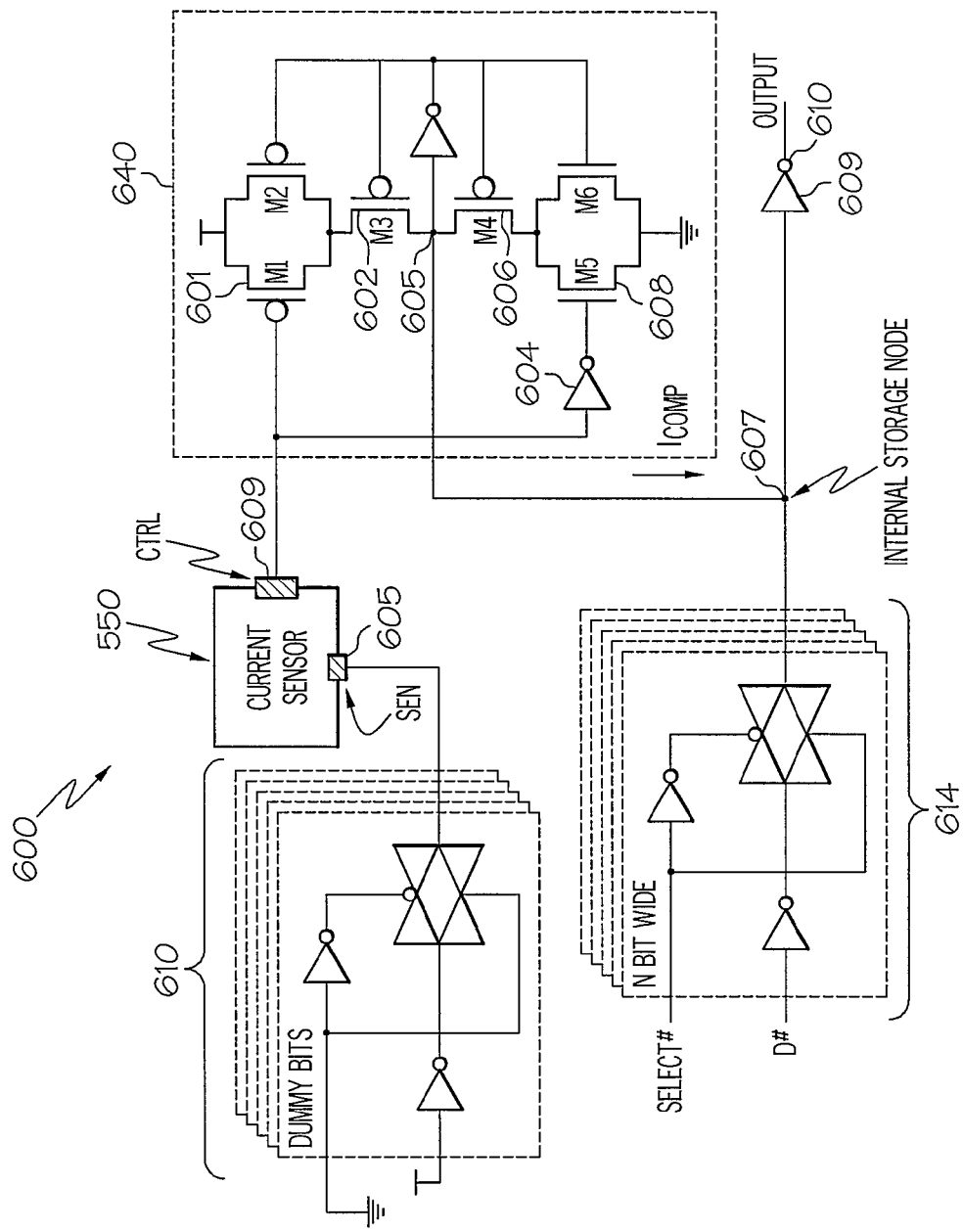
FIG. 6 illustrates an IC with a reconfigurable keeper system including current sensor and dummy cell attached to a load circuit and which provide leakage current compensation, according to an illustrative embodiment of the present invention.

FIG. 6 illustrates an IC with an online, reconfigurable keeper system, which includes additional circuitry used for dynamic (i.e., not-manual) leakage current compensation, according to an illustrative embodiment of the present invention. IC 600 comprises online keeper 640, which includes a plurality of transistors configured similarly to conventional keeper (FIG. 1). Unlike the conventional keeper system (FIG. 1), however, online keeper 640 comprises inverter 604 coupled between ctrl input node (609) and the gate terminal of NFET M5 within pull-down keeper circuit 608, rather than the gate terminal of PFET M1 within the pull-up keeper circuit 601.

IC 600 also comprises N-bit wide static MUX-latch 614, which generates an output signal that is passed through inverter 609 to produce output 610. N-bit wide static MUX-latch 614 is coupled to inverter 609 via a wired path. Keeper 640 is coupled at node 605 to internal storage node 607 (along the output wired path). Keeper 640 comprises a plurality of interconnected transistors, which provide a pull-up keeper circuit 601 and a pull down keeper circuit 608. Keeper 640 also comprises control input node 603 at which a control input (ctrl) is received. Keeper 640 is utilized to provide compensation for leakage current from static MUX-latch 614.

In addition to the above components, IC 600 also comprises current sensor 550, which is connected to control input node 609 (e.g., via control connector 509) of keeper 640, at which online/real-time (i.e., non manual) ctrl input is received by keeper 640 from current sensor 550. Coupled to sen node (e.g., via sen connector 505) of current sensor 640 is dummy (register file) cell 610, which detects and/or mirrors the operations of static MUX-latch 614 to generate similar leakage current as static MUX-latch 614.

Within IC 600, keeper 640 is used to provide compensation for leakage current from N-bit wide static MUX-latch 114. The keeper strength is adjusted in real-time via dynamically generated (i.e., not manual) control signal, ctrl, which is received at ctrl input node 603. When the ctrl (input) is high, keeper 640 will provide additional compensation strength by utilizing pull-up circuit 601 to ensure the robustness on high-leakage dies during normal operation or during burn-in tests. When the ctrl (input) is low, the compensation strength is reduced to a normal level by utilizing pull-down circuit 608 for the low-leakage dies. Compensation for a leakage current induced voltage drop at internal storage node 607 is achieved by the flow of compensation current, which has a type and strength determined by the input signal received at ctrl node 603 generated by current sensor 550. When ctrl is high, the compensation current flows through PFET M3 602 through node 605 and towards internal storage node 607. When ctrl is low, the compensation current flows through NFET M4 through node 605, and towards internal storage node 607.

In IC 600, current sensor 550 is connected to dummy (register file) cell 610, which is a constant leakage source. Detecting the leakage, current sensor 550 produces a compensation enable signal, ctrl, at control node/connector 609. The ctrl (gate) signal adjusts the strength of keeper 640 by switching from pull-up circuit 601 to pull-down circuit 608. With the implementation of IC 600, the compensation enable signal (ctrl) does not need to be provided from an external source. The compensation enable signal (ctrl) is generated in real time by the embedded leakage current monitoring circuit (dummy cell 610) and amplified by current sensor 550.

Current sensor 450 automatically senses the leakage current and generates the compensation enable signal which consequently switches on either transistor M1 601 (of pull-up circuit) or transistor M5 608 (of pull-down circuit) to initiate compensation current flow through internal storage node 607, depending on the type and strength of compensation required.

The keeper system of IC 600 significantly improves upon conventional keeper circuits (FIG. 1) by utilizing dummy cell 610 and current sensor 550. The ctrl signal at ctrl node 603 is provided by automatically sensing the leakage current rather than by the detection of a manual input as provided by conventional keeper systems.

The keeper system of IC 600 may also be used as a burn-in keeper where current sensor 550 generates the online burn-in enable signal. Burn-in tests are done at elevated temperature and supply voltage conditions, which lead to a large increased leakage currents in wide MUX-latch circuits.

Implementation of the invention enables the compensation capability of a strong keeper during elevated conditions and compensation capability of a weaker keeper during normal operational conditions. Thus, the self-adaptive keeper system ensures the flexibility and robustness of the circuit in real time.

Figure 7:
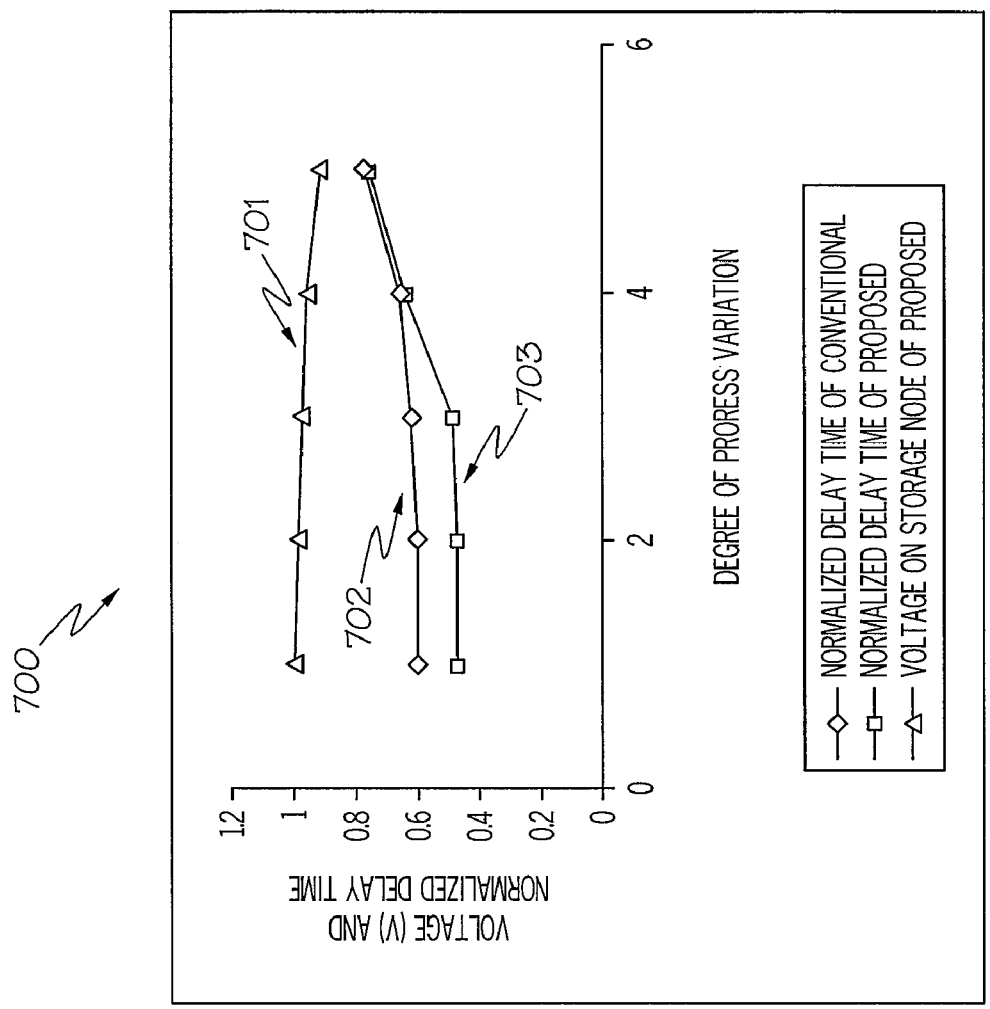
FIG. 7 depicts plots of various process variation tolerant behavior observed during a simulation of the 8-to-1 MUX-Latch (register file) under a wide range of leakage conditions, according to an illustrative embodiment of the invention.

FIG. 7 depicts plots of process variation tolerant behavior observed during a simulation of the 8-to-1 MUX-Latch (register file) under a wide range of leakage conditions using the reconfigurable keeper system of FIG. 6, according to an illustrative embodiment. An 8-to-1 static MUX-Latch using IBM 65-001 technology with a power supply (Vdd) of 1.0 volts is used. Plot 700 shows that voltage plot 701 of the storage/memory node stays firm at "high" with a minimal disturbance that is less than 9% of the power voltage when the input data has not yet been selected. This demonstrates the compensation effects.

In the simulations which produced the results illustrated in plot 700, a voltage represented by a digital "1" is written to and read from the storage node, and the delay is recorded and compared with a conventional register file with a strong keeper designated for worst-case corners. Read/Write plot 703 also shows improvements in read/write delay (hence improved data synchronization) for the described embodiment, compared to the conventional counterpart with Read/Write plot 702. On average, the proposed register file shows over 40% read/write delay improvement for a wide range of process variation, which range represents the majority of dies. For the extreme fast corner or with burn-in conditions, the performance is still slight better. The results clearly show that the process variation tolerant system of the present embodiment does not require an exceeded strength on the keeper. The keeper compensates only when necessary and to the extent that compensation is required.

The keeper system may also be used as a burn-in keeper where the current sensor circuit generates an online burn-in enable signal. The burn-in signal reconfigures the keeper strength to handle the elevated burn-in test conditions with respect to temperature, voltage and leakage current. Having the compensation capability of a strong keeper during elevated conditions and the capability of a weaker keeper during normal operational conditions, the self-adaptive keeper system offers high read/write performance, flexibility and circuit robustness in real time.

While the invention has been particularly shown and described with reference to a preferred embodiment, it will be understood by those skilled in the art that various changes in form and detail may be made therein without departing from the spirit and scope of the invention.

What is claimed is:

1. A device comprising:
    a current sensor having a first connection (sen) node at which a leakage current is sensed and a second connection node at which a compensation enable signal is generated to initiate a compensation of the leakage current via a keeper system, wherein the current sensor includes:
        a plurality of transistors, including a first PFET M7, a second PFET M8 and a third PFET M9, a first NFET M10, and a second NFET M11, wherein the plurality of transistors are interconnected as follows:
            respective source terminals of the first PFET M7, second PFET M8 and third PFET M9 are coupled to a common high voltage node;
            respective gate terminals of the first PFET M7 and second PFET M8 are connected to each other at a common gate node, which gate node is also coupled to a drain terminal of the first PFET M7;
        a drain terminal of the first PFET M7 is connected to the internal storage/memory node;
        a gate terminal of the second PFET M8 is connected at a sense node to a source terminal of the second NFET M11 and to the gate terminals of the third PFET M9 424 and first NFET M10; the third PFET M9 is coupled at its drain terminal to the source terminal of the first NFET M10; and
        the drain terminal of the first NFET M10 is coupled to a common ground node with the drain terminal of the second NFET M11, whose gate is coupled to the high voltage node; and
    a sen node and a cntrl node, wherein the sen node is the first connection node and the cntrl node is the second connection node, which enable coupling of the current sensor to a dummy cell and the online keeper, respectively;
    a load circuit that emits a load leakage current on an wired output path;
    an online keeper coupled to an internal storage/memory leakage node on the wired output path and which has a control input point that is coupled to the second connection node of the current sensor to receive the compensation enable signal; and
    a dummy circuit configured similarly to the load circuit and which generates a substantially exact amount of leakage current as the load circuit, wherein an output of the dummy circuit is coupled to the first connector of the current sensor, which enables the current sensor to sense the amount of leakage current within the dummy circuit and adjust a magnitude of the compensation enable signal generated at the control input of the online keeper wherein the current sensor amplifies the sensed leakage current to generate the compensation enable signal, a magnitude of which activates a specific amount of compensation current required for compensating the sensed amount of leakage current;
    wherein the online keeper generates the compensation current based on the magnitude of the compensation enable signal;
    wherein the compensation current generated provides a dynamic online (real-time) compensation of the load leakage current.

2. The device of claim 1, further comprising:
    a current leakage source, which generates leakage current that matches a leakage current generated by a load circuit;
    a keeper transistor (PFET) M1, which is coupled in parallel across first PFET M7, such that the keeper transistor M1 also has its source terminal connected to a common high voltage node and its drain terminal connected to the drain terminal of the first PFET M7 at an internal memory node; and
    wherein the keeper transistor M1 generates a compensation current, which is passed to the current leakage source through the internal memory node.

3. The device of claim 2, wherein:
    the current sensor further provides a ctrl node, which is a point of connection between the drain terminal of third PFET M9 and first NFET M10, wherein said ctrl node is a point of connectivity between the current sensor and a gate terminal of one or more keeper transistors; and
    wherein the level of leakage current is dynamically changed to provide deterministic responses from an online keeper system enhanced with the current sensor.

4. The device of claim 1, wherein the device is an integrated circuit (IC) manufacture on an IC die.

5. The device of claim 1, wherein the current sensor is a stand alone circuit configured with a sen connector and a cntl connector to enable the current sensor to be coupled to the dummy circuit and the online keeper via respective connectors, post manufacture of the device.

6. In an integrated circuit design, a method comprising:
    coupling a compensation enable signal generated by a current sensor to a control input node of an online keeper, wherein the current sensor comprises:
        a plurality of transistors, including a first PFET M7, a second PFET M8 and a third PFET M9, a first NFET M10, and a second NFET M11, wherein the plurality of transistors are interconnected as follows:
            respective source terminals of the first PFET M7, second PFET M8 and third PFET M9 are coupled to a common high voltage node;
            respective gate terminals of the first PFET M7 and second PFET M8 are connected to each other at a common gate node, which gate node is also coupled to a drain terminal of the first PFET M7;
        a drain terminal of the first PFET M7 is connected to the internal storage/memory node;
        a gate terminal of the second PFET M8 is connected at a sense node to a source terminal of the second NFET M11 and to the gate terminals of the third PFET M9 424 and first NFET M10;
        the third PFET M9 is coupled at its drain terminal to the source terminal of the first NFET M10; and
        the drain terminal of the first NFET M10 is coupled to a common ground node with the drain terminal of the second NFET M11, whose gate is coupled to the high voltage node;

a sense (sen) node and a cntrl node, wherein the sen node is the first connection node and the cntrl node is the second connection node, which enable coupling of the current sensor to the dummy cell and the online keeper, respectively;

a ctrl node, which is a point of connection between the drain terminal of third PFET M9 and first NFET M10, wherein said ctrl node is a point of connectivity between the current sensor and a gate terminal of one or more keener transistors; and wherein the level of leakage current is dynamically changed to provide deterministic responses from an online keeper system enhanced with the current sensor;

coupling the sense node of the current sensor to a dummy cell that detects a leakage current from a load and generates a substantially exact amount of leakage current, wherein the leakage current within the dummy cell is received and amplified by the current sensor to generate the compensation enable signal;

coupling the keeper to an internal storage/memory node of the output of the load through which load leakage current is passed; and wherein online, real-time compensation of the load leakage current is dynamically generated by the keeper system when said real-time compensation is required and to the extent that real-time compensation is required.

7. The method of claim 6, wherein:

the keeper is a burn-in keeper and the current sensor generates an online burn-in enable signal; and the burn-in enable signal reconfigures a keeper strength to handle the elevated burn-in test conditions with respect to temperature, voltage and leakage current, such that the keeper exhibits compensation capability of a strong keeper during elevated conditions and the keeper exhibits compensation capability of a weaker keeper during normal operational conditions.

* * * * *